US006413307B2

(12) United States Patent
Vollath et al.

(10) Patent No.: US 6,413,307 B2
(45) Date of Patent: Jul. 2, 2002

(54) METHOD OF PRODUCING A PIGMENT CONTAINING GOLD

(75) Inventors: Dieter Vollath, Stutensee; Steffen Heidenreich, Linhenheim-Hochstetten; Friedrich Wacker, Landau, all of (DE)

(73) Assignee: Forschungszentrum Karlsruhe, Karlsruhe (DE)

( * ) Notice: Subject to any disclaimer, the term of this patent is extended or adjusted under 35 U.S.C. 154(b) by 49 days.

(21) Appl. No.: 09/725,336

(22) Filed: Nov. 29, 2000

Related U.S. Application Data

(63) Continuation-in-part of application No. PCT/EP99/03405, filed on May 18, 1999.

(30) Foreign Application Priority Data

May 30, 1998 (DE) .......................................... 198 24 440

(51) Int. Cl.[7] ............................ B01J 19/12; B01J 12/02; C09C 3/06

(52) U.S. Cl. ....................... 106/403; 106/401; 106/436; 106/450; 106/454; 106/456; 106/481

(58) Field of Search ................................. 106/401, 403, 106/481, 436, 450, 456, 454

(56) References Cited

FOREIGN PATENT DOCUMENTS

DE          94 03 581        6/1994

*Primary Examiner*—Elizabeth D. Wood
(74) *Attorney, Agent, or Firm*—Klaus J. Bach

(57) ABSTRACT

In a method of manufacturing a gold containing pigment, a vaporizable gold compound, a vaporizable compound of another metal, which includes an oxide or a nitride with a melting temperature above the melting temperature of gold, and a reaction gas consisting of a mixture of argon and oxygen are introduced into a first microwave plasma, whereby cores covered with gold clusters are formed from the oxide or nitride and the gold cluster covered cores are subjected to a tempering process at 150° C. to 300° C. for causing coloration of the gold cluster covered oxide or nitride cores.

6 Claims, No Drawings

# METHOD OF PRODUCING A PIGMENT CONTAINING GOLD

This is a continuation-in-part application of international application PCT/EP99/03405 filed May 18, 1999 and claiming the priority of German application 198 24 440.1 filed May 30, 1998.

BACKGROUND OF THE INVENTION

The invention relates to a method of producing a gold-containing pigment from a gold compound that can be vaporized.

Gold-containing pigments have been used for a long time in the manufacture of red glazes, so-called ruby glazes. To this end, gold colloids ("cassius gold purple"), which were manufactured in an aqueous solution and stabilized with tin acid were melted into alkaline silicate glasses wherein, after tempering, the desired red color is formed (see Gmelin, manual of the inorganic chemistry, vol. 62 [Au], p. 399).

Ruby glazes are described in detail by W. Vogel, Glass-chemistry, Vol. 3, chapter 9.5, Springer Verlag 1992. Subsequently, the color formation process by tempering of ruby glazes is initiated wherein gold colloids precipitate and agglomerate. Also, the effects of protective colloid additives is discussed in this publication. These protective colloid additives have the effect that the tempering does not result in a complete deflocculation of the colloid particles formed. The protective colloid additives envelope the gold colloids if the number of the protective colloid particles is greater and their dimensions are smaller than those of the gold particles (envelope-protection). Tin acid sols in aqueous solutions have been found to be advantageous protective colloids for gold sols. In the red gold ruby glass, the gold colloid particles have a size in the range of 50 to 60nm.

DE 94 03 581 U discloses a coated nano-powder and an apparatus for the manufacture thereof. The coated nano-powder is manufactured in such a way that the core is formed in a first microwave plasma and the coating is formed in a second microwave plasma. The core may consist of a metal nitride or a metal oxide, whereas the coating may consist of an oxide, a nitride or a carbide of another metal.

DE 196 38 601 Cl discloses a method for the manufacture of particles with a core and an envelope. In this method, a vaporizable metal compound is introduced, together with a reaction gas, into a microwave plasma wherein the cores of the particles are formed. For the manufacture of the envelope of the particles, a second microwave plasma is not needed; rather, for providing the envelope, an organic compound, which can be polymerized, is polymerized on the core by the UV light of the microwave plasma. In this method, no material can be used for the envelope, which cannot be polymerized by exposure to light.

It is the object of the present invention to provide a method for the manufacture of gold-containing pigments without the use of aqueous chemical processes.

SUMMARY OF THE INVENTION

In a method of manufacturing a gold containing pigment, a vaporizable gold compound, a vaporizable compound of another metal which includes an oxide or a nitride with a melting temperature above the melting temperature of gold and a reaction gas consisting of a mixture of argon and oxygen are introduced into a first microwave plasma, whereby cores covered with gold clusters are formed from the oxide or nitride, and the gold cluster covered cores are subjected to a tempering process at 150° C. to 300° C. for causing coloration of the gold cluster covered oxide or nitride cores.

In accordance with the invention, gold-containing pigments can be synthesized in a microwave plasma apparatus as it is disclosed in the above-mentioned DE 94 03 581 U or by D. Vollath and K. E. Sickafus in "Nanostructured materials", vol. 1, pp. 427–437, 1992. In such an apparatus, several microwave plasmas, for example, three plasmas, one disposed after another can be generated such that the reaction gas and the initial products and, respectively, intermediate products flow serially through the plasmas.

A vaporizable gold compound, a vaporizable compound of another metal and an oxygen and/or nitrogen-containing reaction gas are conducted into a first microwave plasma. As other metals especially such metals which form oxides or nitrides with a melting point above the melting point of gold (1064° C.) are suitable such as zirconium, titanium, iron, chromium or manganese. As vaporizable metal compounds preferably the halogenides are employed. However, carbonyls or metal-organic compounds such as alkoholates also of gold and the other metal may be used. As reaction gas, a mixture of argon and oxygen is suitable for the manufacture of oxide cores. For the manufacture nitride cores hydrogen either together with nitrogen or ammonia, for example at a volume ratio of 4:1 or dry air resulting in oxide cores may be used. The gold compound and the compound of the other metal are introduced at a mole ratio of 1:1 to 1:1000. The reaction gas is used in a stoichiometric excess relative to the oxygen and/or hydrogen content.

As has been determined by an electron microscope examination, in this process step cores of the oxide or nitride of the other metal covered with gold clusters are formed without the need for a second microwave plasma. The cores are spherical and have a diameter of 5 to 10 nm. The gold clusters have a diameter of 1 to 1.5 nm.

The particles obtained after this step are light in color. They are for example white with a slight yellow or purple hue. They can be subjected subsequently to tempering at temperatures of between 150° C. and 300° C., preferably between 150° C. and 200° C., whereby the desired color is obtained.

Before the tempering step, the gold particles are stabilized preferably by tin oxide. This can be achieved for oxide cores by reacting the particles together with a vaporizable tin compound such as tin chloride in a subsequent second microwave plasma with the reaction gas which, in this case, contains oxygen. With nitride cores however, the stabilization must be obtained by an aqueous chemical process.

Before the pigment is melted into a glazing, the particles should be enveloped by a protective matrix. With oxide cores, this can be achieved in a subsequent third microwave plasma. In this case, oxygen-containing reaction gas is used, which does not include any other reactive components. As material for the protective matrix zirconium, $ZrSiO_4$ is particularly suitable. The zirconium layer can be obtained in the microwave plasma with equi-molar amounts of zirconium chloride and silicon chloride. The production of the layer in the microwave plasma provides for relatively thin layers. If thicker layers are required, the thin zirconium layer produced with the plasma procedure can be reinforced by one of the aqueous chemical processes. The nitride cores must be coated also by an aqueous chemical procedure.

Below, the invention will be described in greater detail on the basis of examples.

EXAMPLE 1

Cores of aluminum oxide ($Al_2O_3$) covered with gold clusters were manufactured. As raw product $AlCl_3$ with 10 at % gold chloride ($AuCl_3$) was used. As reaction gas, a gas mixture of argon with 10 vol % oxygen was used. The conversion was performed in the apparatus described in DE 94 03 581 U under the following reaction conditions:
Temperature: 450° C.
System pressure: 20 mbar
Gas flow: 20 Nl/min
Microwave frequency: 915 MHz
Microwave energy: about 2 kW
Microwave resonator: rotating $TE_{11}$ mode The product of the synthesis is white. After heating to 160° C. a red color occurred.

EXAMPLE 2

Cores of $Al_2O_3$ were produced which were subsequently coated with $ZrO_2$.

As raw product, in the first stage aluminum chloride $AlCl_3$ with about 10 at % gold chloride $AuCl_3$ and as reaction gas, argon with 10 vol % oxygen were used. The reaction temperature in this stage was 544° C.

The product of the synthesis was subsequently coated with zirconium oxide in a second microwave plasma zone and stabilized thereby. The cores covered by the gold clusters were transported by the reaction gas of the first stage to the second plasma zone. The raw product for the coating was $ZrCl_4$. The reaction temperature in the second stage was 669° C.

In both stages the processes were performed under the following reaction conditions:
System pressure: 20 mbar
Gas flow: 20 Nl/min
Microwave frequency: 915 MHz
Microwave energy: about 2 kW
Microwave resonator: rotating $TE_{11}$ mode The product of synthesis is white. After heating to about 180° C., the red color occurred.

EXAMPLE 3

Cores of $Al_2O_3$ covered with gold clusters were produced which were subsequently coated with $ZrO_2$ and $SiO_2$, wherein the following reaction conditions were maintained:
Starting products, stage 1: $AlCl_3$ with about 10 at % $AuCl_3$
Reaction gas: Argon with 20 vol % oxygen
Temperature: 544° C.
Raw product of the coating in stage 2: 50 at % $ZrCl_4$
Temperature: 669° C.
Raw product of the coating in stage 3: 50 at % $SiCl_4$
Temperature: 669° C.
All three stages were performed under the following conditions:
System pressure: 20 mbar
Gas flow: 20 Nl/min
Microwave frequency: 915 MHz
Microwave energy: about 2 kW
Microwave resonator: rotating $TE_{11}$ mode
The remaining reaction conditions correspond to those of example 3.
The product of the synthesis is white. After heating to about 180° C., the color becomes red.

EXAMPLE 4

Cores of $Al_2O_3$ covered with gold clusters were produced and subsequently coated with $ZrO_2$ and $SiO_2$, wherein the following reaction conditions were maintained:
Raw products stage 1: $AlCl_3$ with about 10 at % $AuCl_3$
Temperature: 593° C.
Raw product stage 2: $SiCl_4$
Temperature: 740° C.
Raw product stage 3: $ZrC_4$
Temperature: 650° C.
System pressure: 20 mbar
Gas flow: 20 Nl/min
Microwave frequency: 915 MHz
Microwave energy: about 2 kW
Microwave resonator: rotating $TE_1$ mode
The remaining reaction conditions correspond to those of example 3.
The product of the synthesis is white. After heating to about 180° C., the color becomes red.

EXAMPLE 5

Cores of $Al_2O_3$ covered with gold clusters were manufactured and subsequently coated with $SnO_2$, $ZrO_2$ and $SiO_2$, wherein the following reaction conditions were selected:
Raw products stage 1: $AlCl_3$ with about 10 at % $AuCl_3$
Temperature: 540° C.
Reaction gas: argon with 20 vol % oxygen
Raw product stage 2: 50 at % $SnCl_4$
Temperature: 620° C.
Raw product stage 3: $SiCl_4$, $ZrCl_4$, each 50 at %
Temperature: 640° C.
All three stages were performed with the following reaction conditions:
System pressure: 20 mbar
Gas flow: 20 Nl/min
Microwave frequency: 915 MHz
Microwave energy: about 2 kW
Microwave resonator: rotating $TE_{11}$ mode
The product of synthesis is white. After heating to over 200° C., the color becomes red.

EXAMPLE 6

Cores of zirconium nitride ZrN were manufactured. As raw product $ZrCl_4$ with about 10 at % $AuCl_3$ and as reaction gas nitrogen with 4 vol % hydrogen were employed.

The following reaction conditions were maintained:
System pressure: 16 mbar
Gas flow: 50 Nl/min
Microwave frequency: 915 MHz
Microwave energy: about 2 kW
Microwave resonator: $TE_{10}$ mode
The product of synthesis is purple. After heating to 300° C., additionally a red hue occurred.

What is claimed is:

1. A method of manufacturing a gold-containing pigment, comprising the steps of:

providing a vaporizable gold compound, a vaporizable compound of another metal, which includes an oxide with a melting temperature above the melting temperature of gold, and a reaction gas consisting of a mixture of argon and oxygen for the manufacture of oxide cores, introducing the gold compound and the compound of the other metal together with the reaction gas into a first microwave plasma whereby cores covered with gold clusters are formed from the oxide, subjecting the gold-cluster covered cores to a tempering process at 150° C. to 300° C. for causing coloration of said gold cluster-covered oxide cores.

2. A method according to claim 1, wherein said gold cluster-covered oxide cores consist of an oxide and are introduced, together with tin oxide and a vaporizable tin compound, into a second microwave plasma for stabilizing said gold cluster-covered oxide cores.

3. A method according to claim 2, wherein, after the stabilizing step, the gold cluster-covered cores are introduced, together with a vaporizable silicon compound and an oxygen-containing reaction gas, into a third microwave plasma.

4. A method of manufacturing a gold-containing pigment, comprising the steps of:

providing a vaporizable gold compound, a vaporizable compound of another metal which includes an oxide with a melting temperature above the melting temperature of gold, and a reaction gas consisting of a mixture of hydrogen and one of nitrogen and ammonia for the manufacture of nitride cores, introducing the gold compounds and the compound of the other metal into a first microwave plasma, whereby nitride cores covered with gold clusters are formed and subjecting the gold-cluster covered nitride cores to a tempering process at 150° C. to 300° C. for causing a coloration of the gold-cluster covered nitride cores.

5. A method according to claim 4, wherein said gold cluster-covered nitride cores consist of an oxide and are introduced, together with tin oxide and a vaporizable tin compound, into a second microwave plasma for stabilizing said gold cluster-covered nitride cores.

6. A method according to claim 5, wherein after the stabilizing step the gold cluster-covered cores are introduced together with a vaporizable silicon compound and an oxygen-containing reaction gas, into a third microwave plasma.

* * * * *